United States Patent [19]

Kimura et al.

[11] Patent Number: 5,019,729

[45] Date of Patent: May 28, 1991

[54] TTL TO CMOS BUFFER CIRCUIT

[75] Inventors: Tohru Kimura, Sagamihara; Syuso Fujii, Kawasaki; Takashi Ohsawa, Yokohama, all of Japan

[73] Assignee: Kabushiki Kaisha Toshiba, Kawasaki, Japan

[21] Appl. No.: 382,493

[22] Filed: Jul. 21, 1989

[30] Foreign Application Priority Data

Jul. 27, 1988 [JP] Japan .................. 63-187530

[51] Int. Cl.⁵ ............... H03K 19/092; H03K 19/096; H03K 19/003; H03K 17/16
[52] U.S. Cl. .................. 307/475; 307/443; 307/451; 307/481; 323/315
[58] Field of Search ........... 307/475, 443, 481, 580, 307/582–585, 264, 290, 451; 323/312, 315, 316, 317; 330/288

[56] References Cited

U.S. PATENT DOCUMENTS

| | | | |
|---|---|---|---|
| 4,264,874 | 4/1981 | Young | 307/451 X |
| 4,275,316 | 6/1981 | Knapp | 307/451 X |
| 4,380,710 | 4/1983 | Cohen et al. | 307/475 |
| 4,471,242 | 9/1984 | Noufer et al. | 307/451 X |
| 4,618,785 | 10/1986 | van Tran | 307/475 X |
| 4,717,845 | 1/1988 | Dunn | 307/475 |
| 4,767,942 | 8/1988 | Minami et al. | 330/288 X |
| 4,800,303 | 1/1989 | Graham et al. | 307/475 X |

FOREIGN PATENT DOCUMENTS 63-132526 6/1988 Japan .

Primary Examiner—Stanley D. Miller
Assistant Examiner—David R. Bertelson
Attorney, Agent, or Firm—Finnegan, Henderson, Farabow, Garrett and Dunner

[57] ABSTRACT

A buffer circuit includes first and second differential amplification type buffer circuits. The input nodes of the first and second differential amplification type buffer circuits are connected together and the output nodes of the first and second differential amplification type buffer circuits are also connected to each other. The first differential amplification type buffer circuit is constituted by a pair of driving P-channel MOS transistors and N-channel MOS transistors acting as loads of the P-channel MOS transistors and connected to constitute a current mirror circuit. The second differential amplification type buffer circuit is constituted by P-channel MOS transistors acting as loads and connected to constitute a current mirror circuit and a pair of driving N-channel MOS transistors.

31 Claims, 14 Drawing Sheets

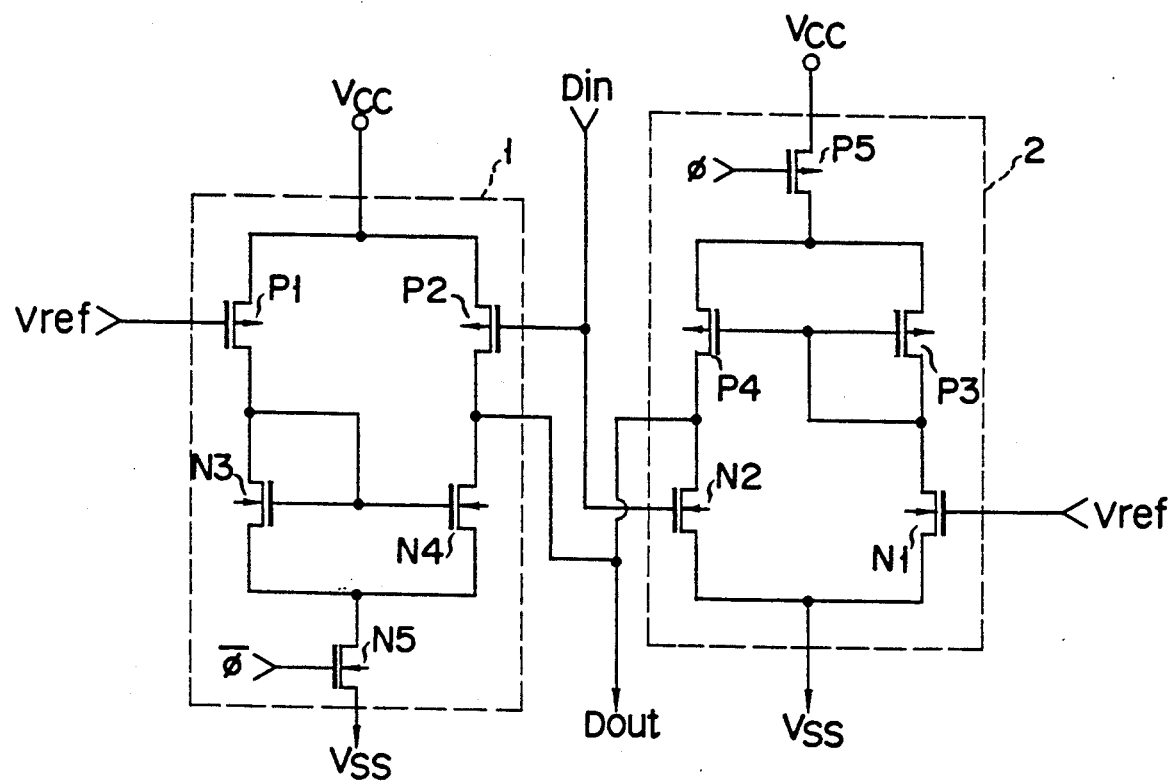
F I G. 5

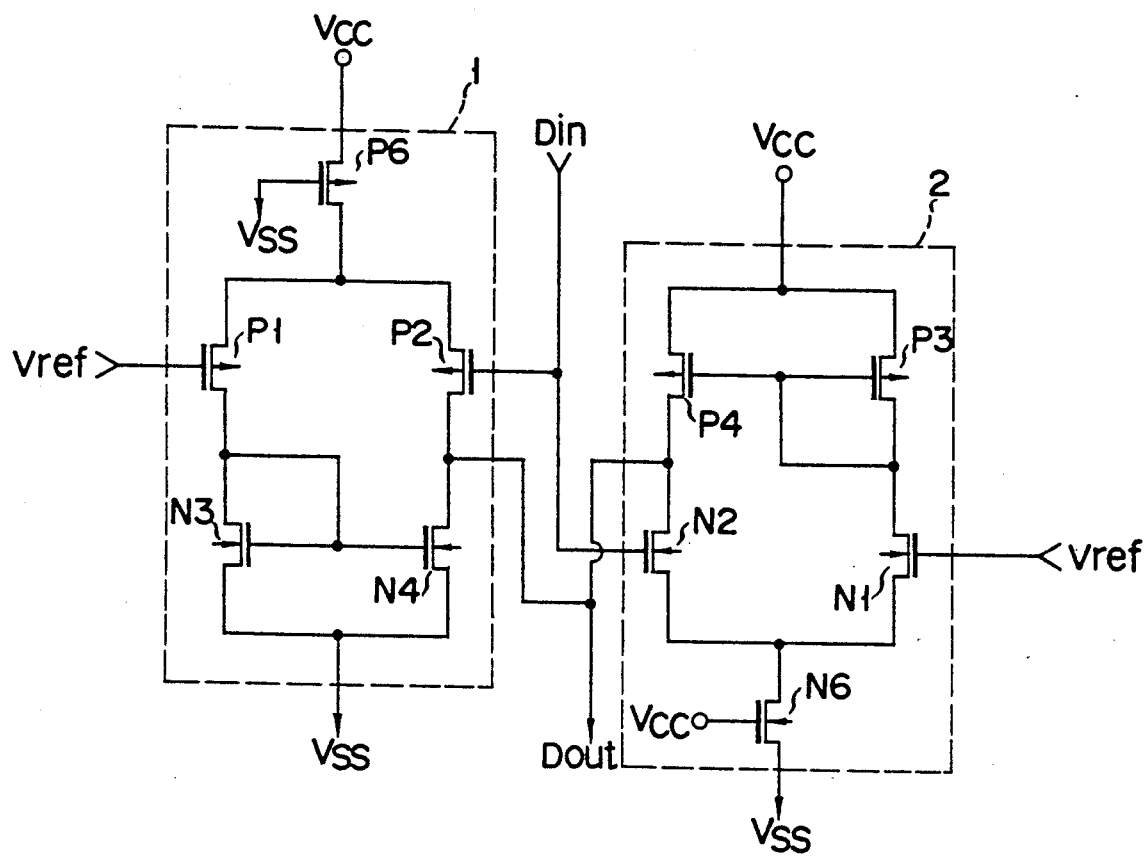
F I G. 11

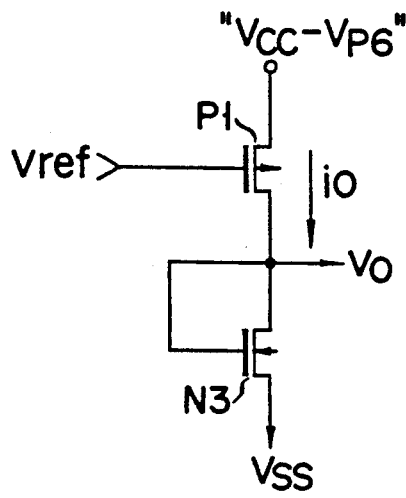
F I G. 12A
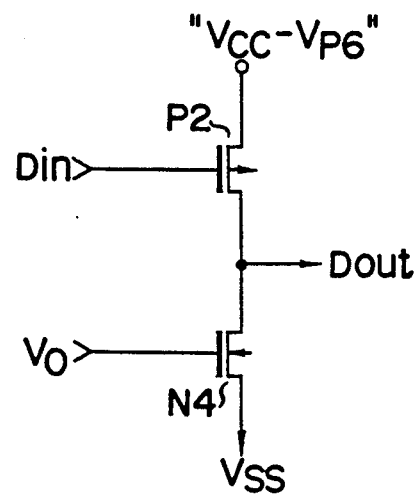
F I G. 12B
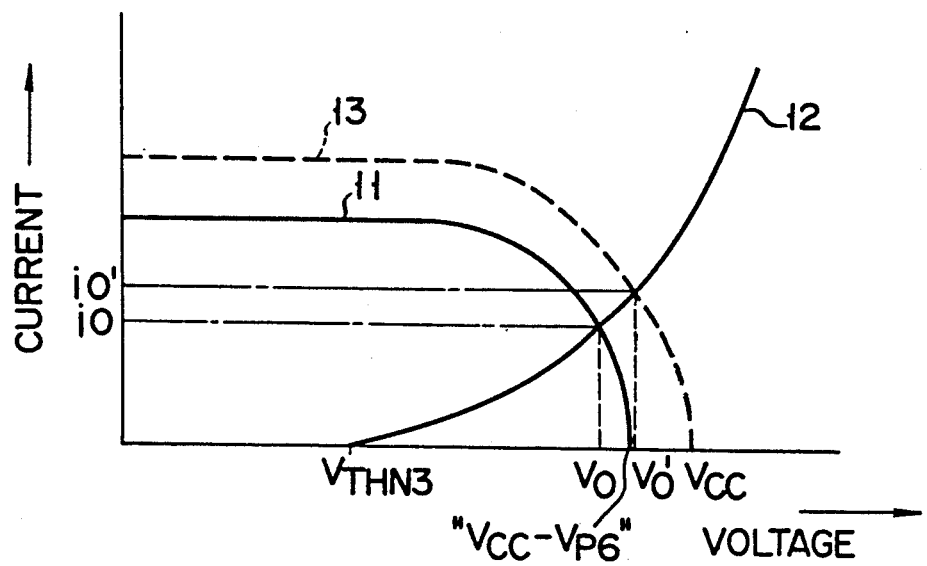
F I G. 13

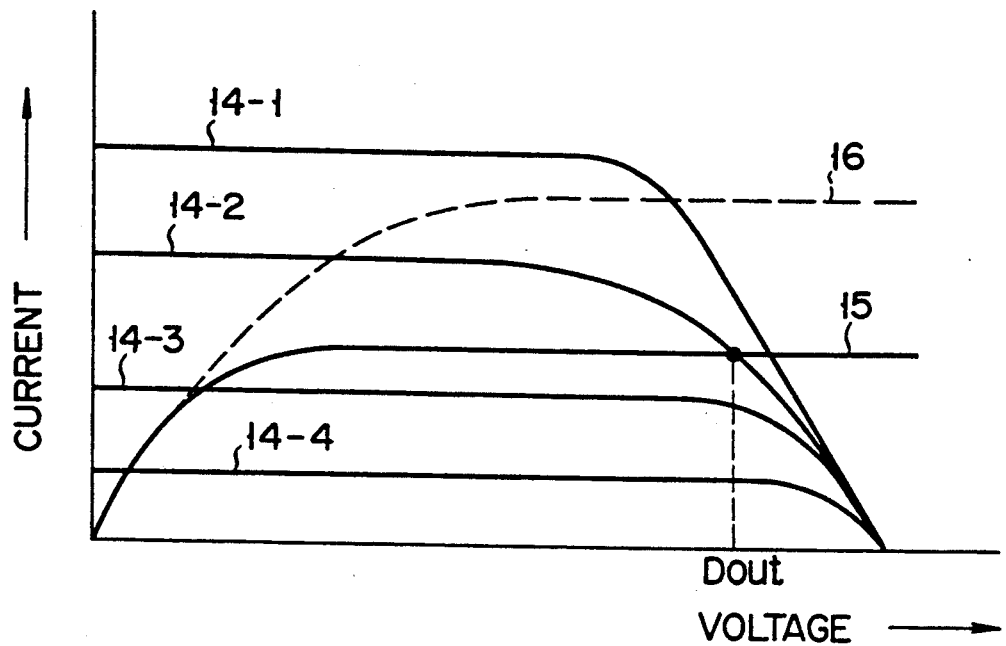
F I G. 14
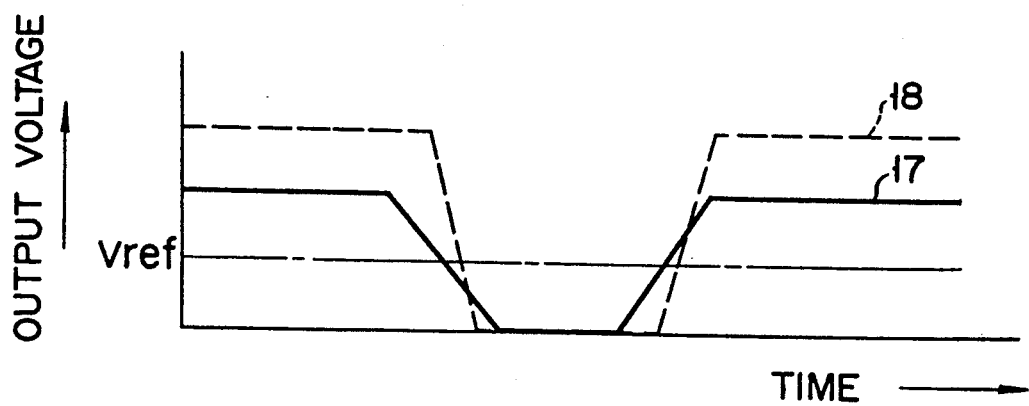
F I G. 15

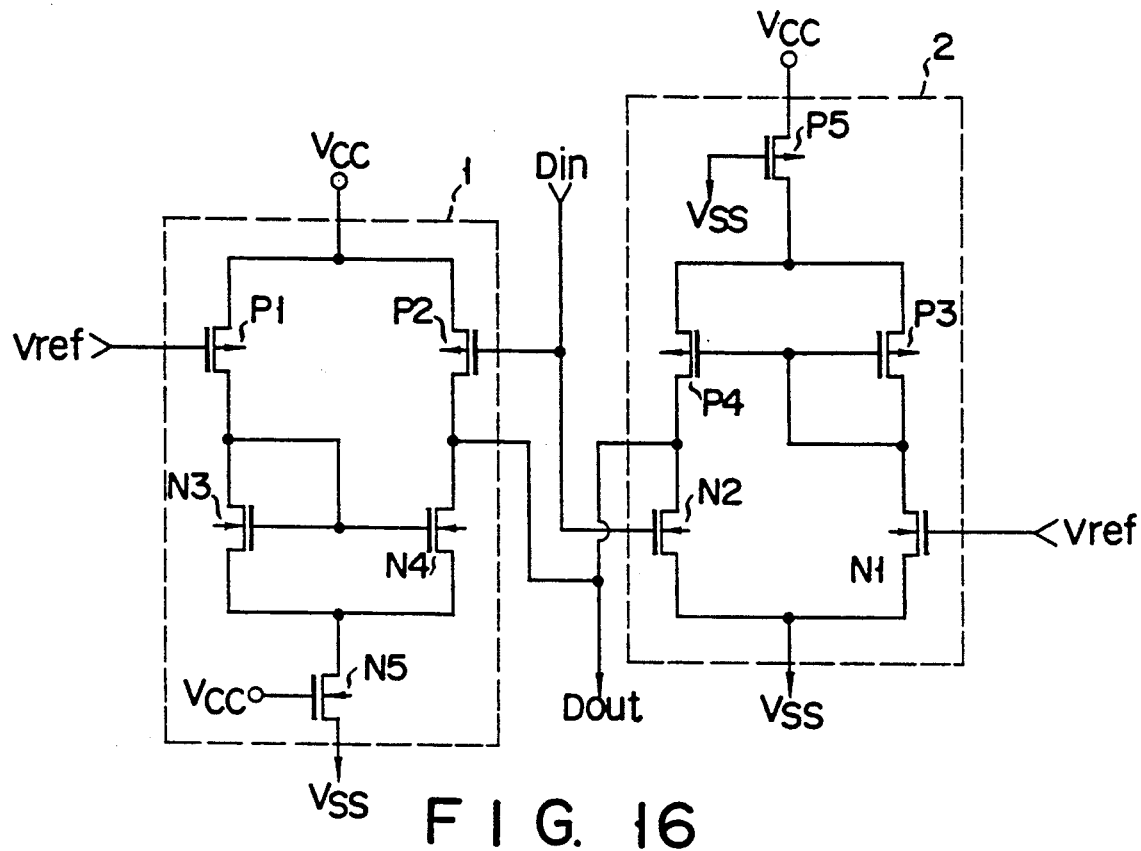
F I G. 16
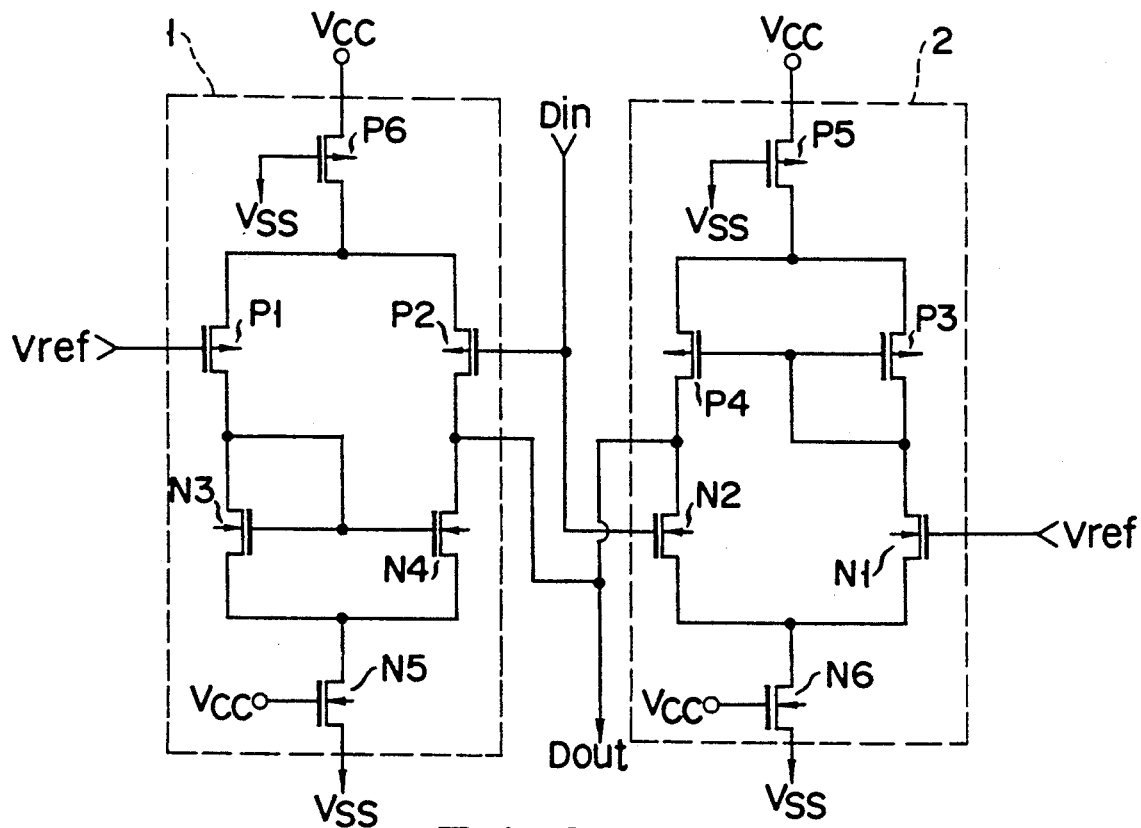
F I G. 17

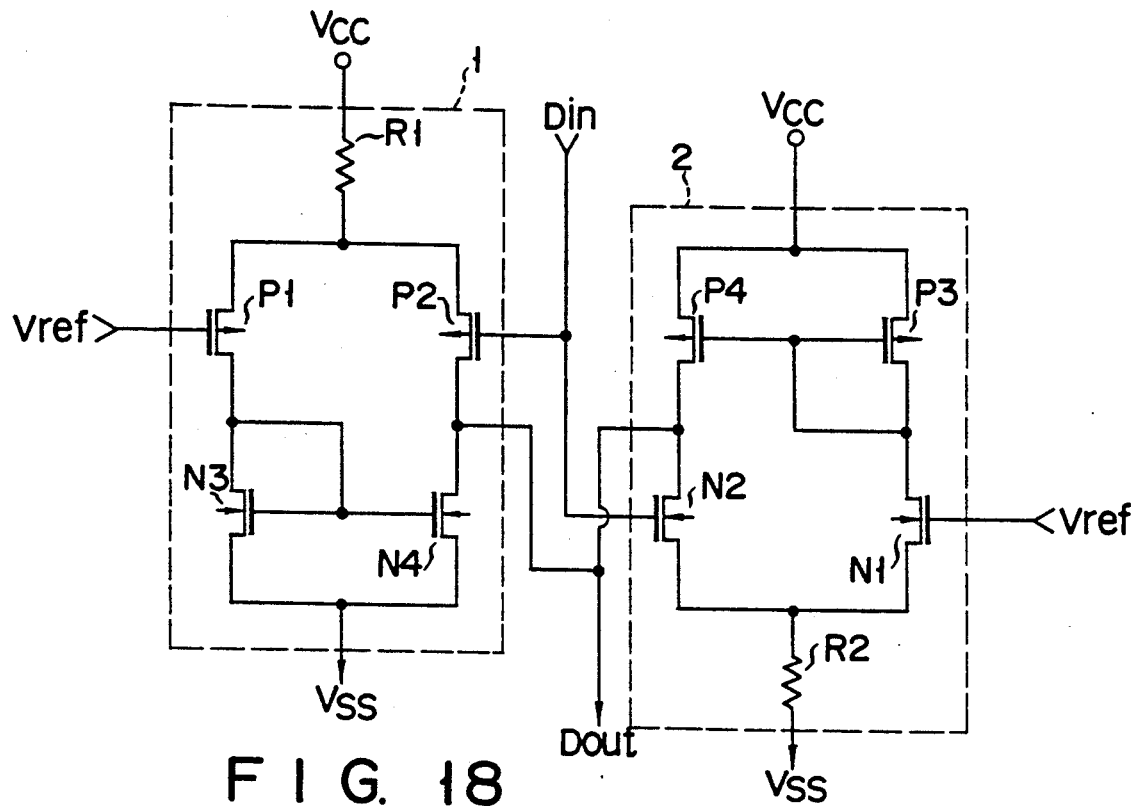
F I G. 18
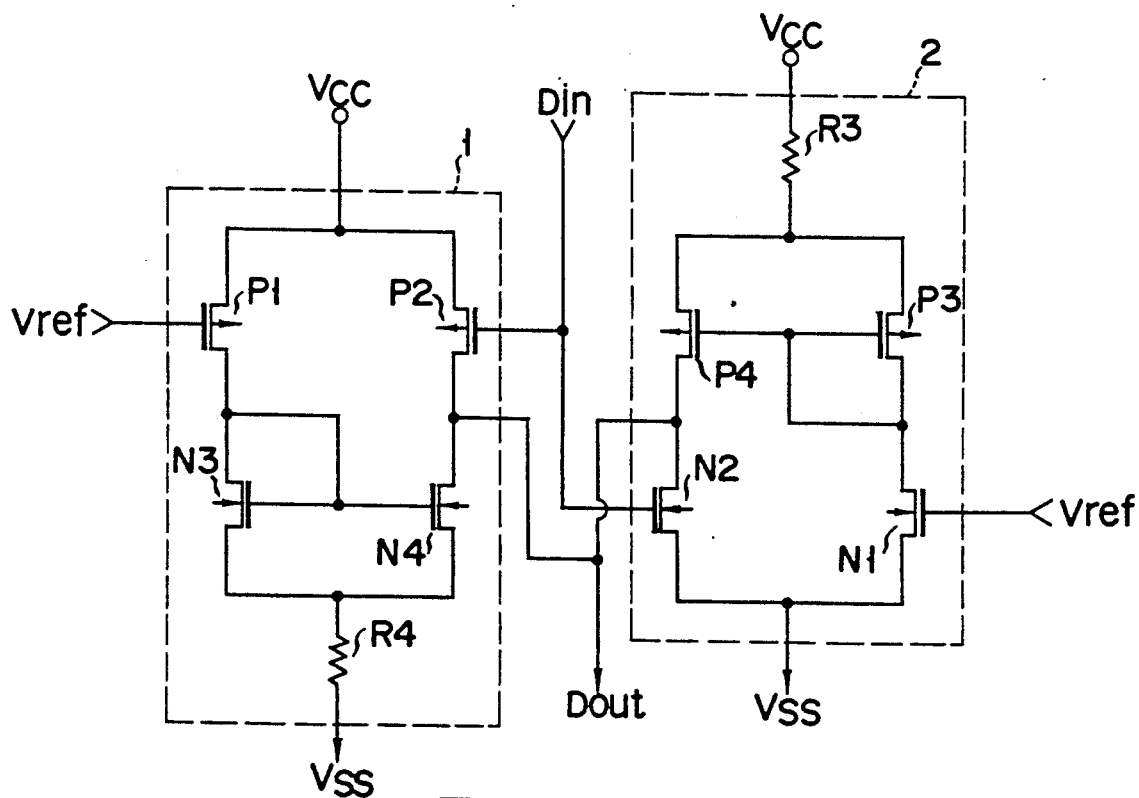
F I G. 19

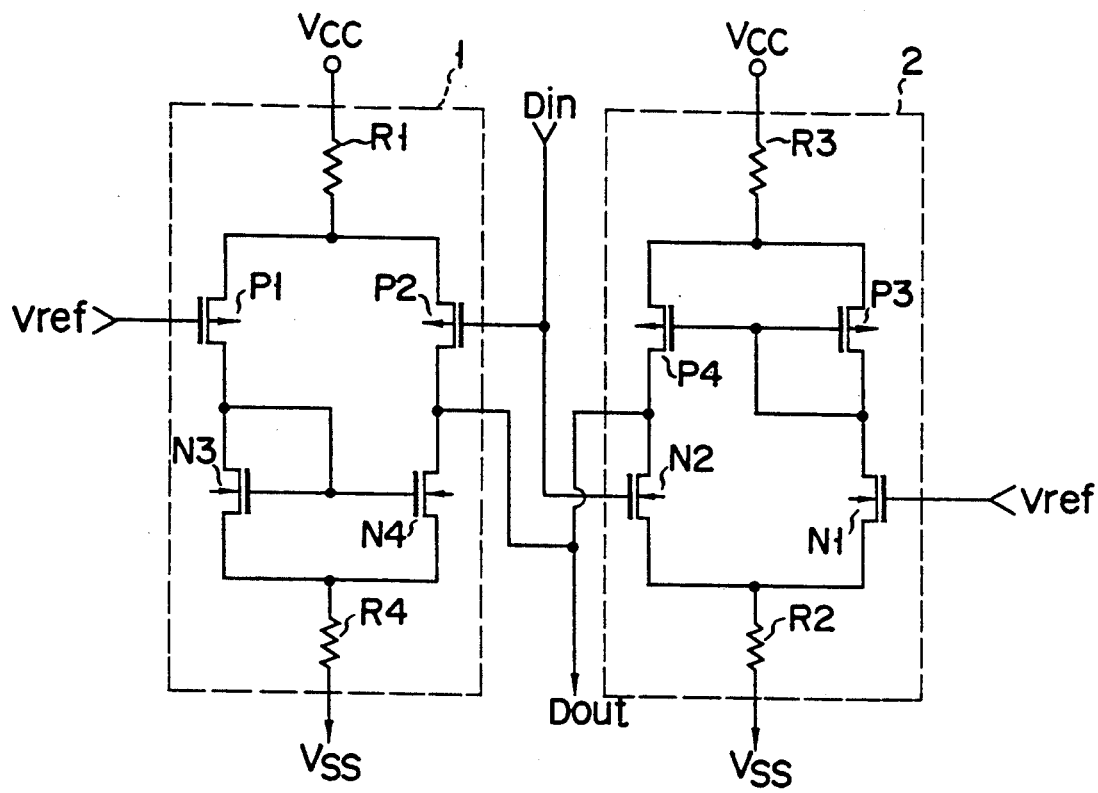
F I G. 20
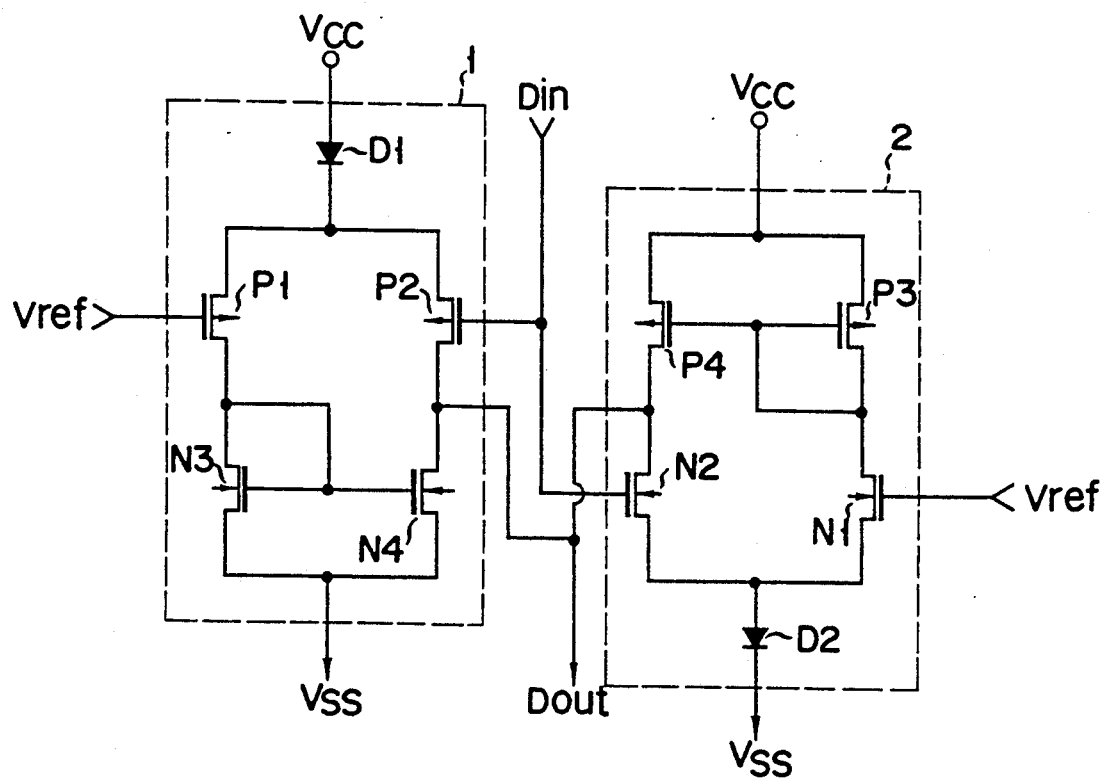
F I G. 21

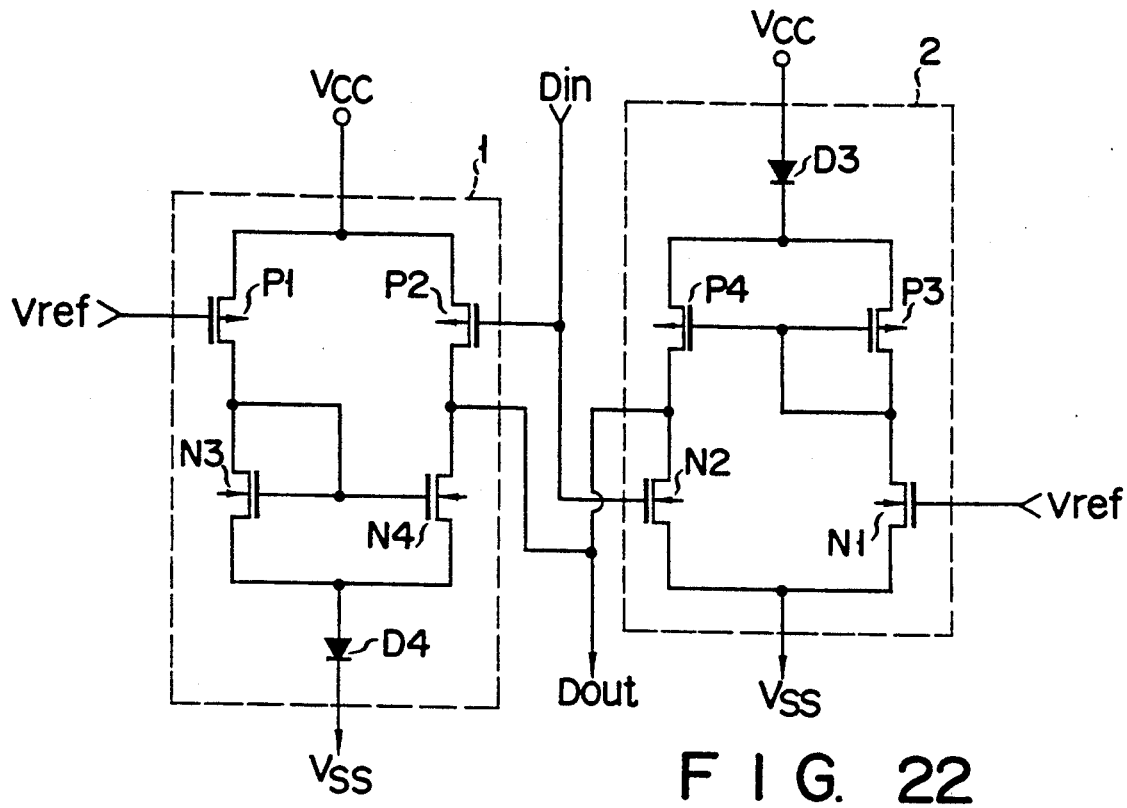
F I G. 22
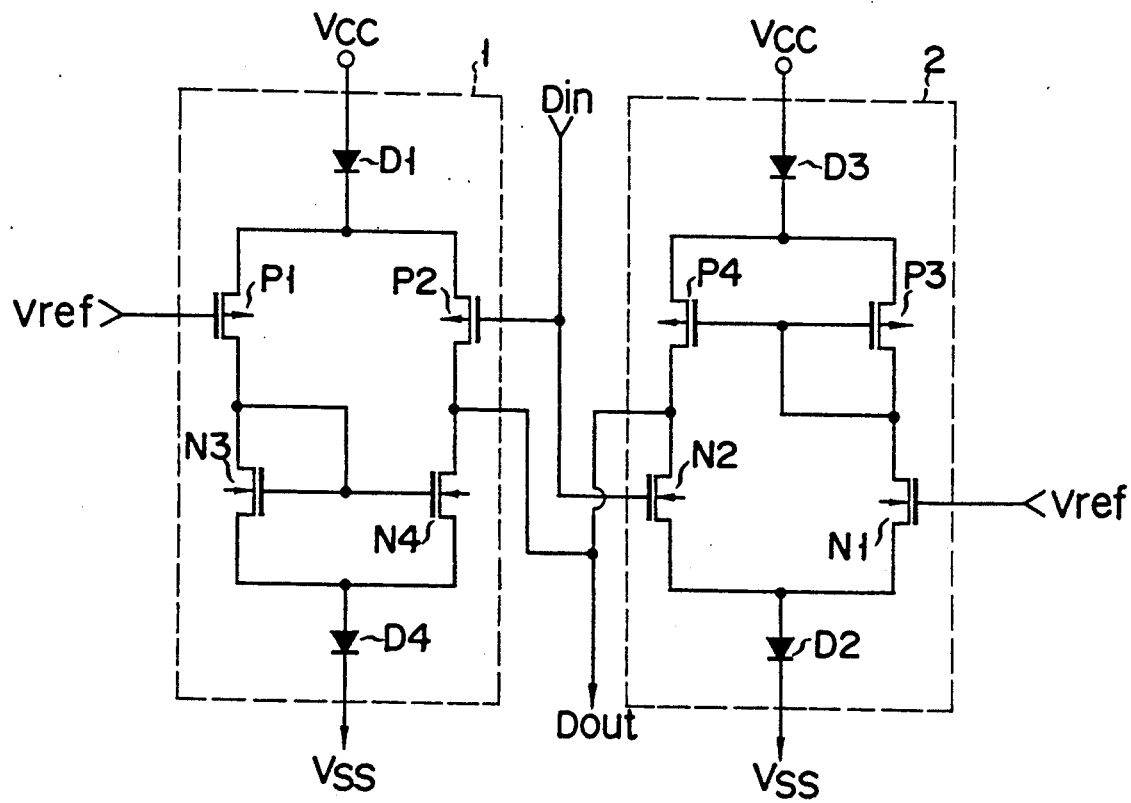
F I G. 23

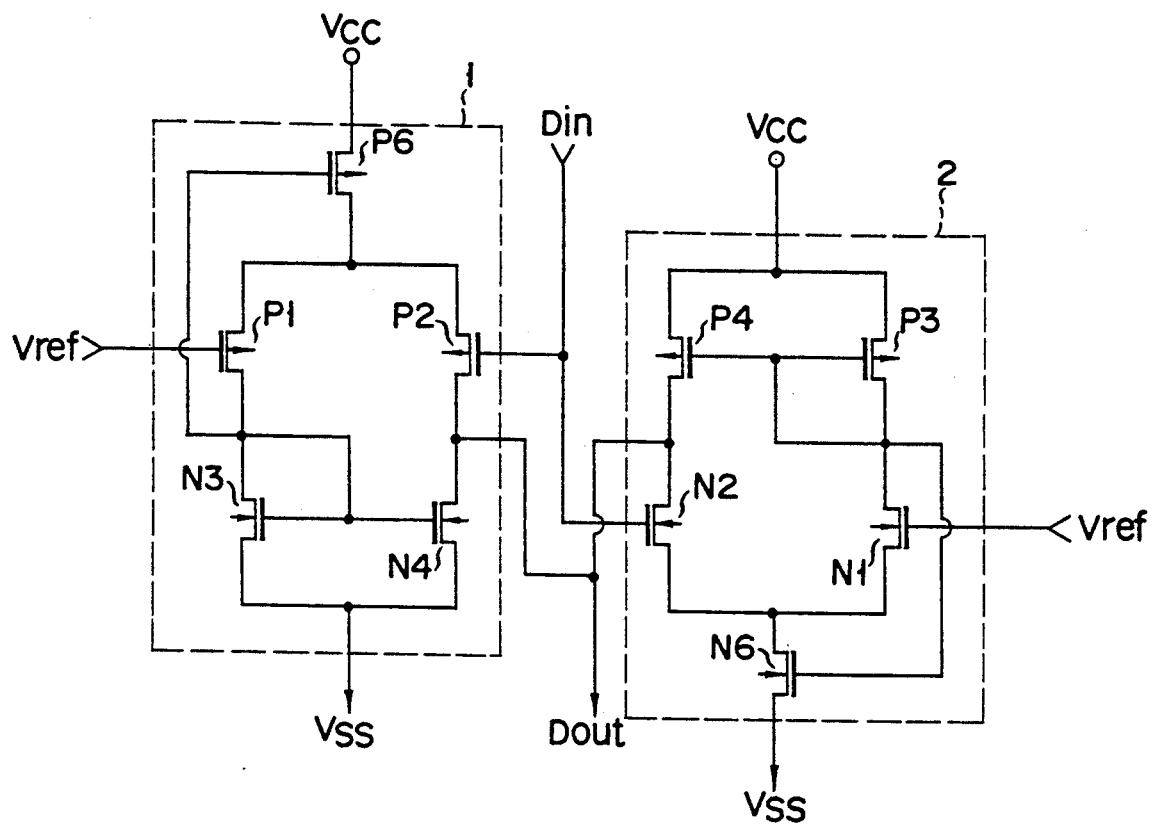
F I G. 24

TTL TO CMOS BUFFER CIRCUIT

BACKGROUND OF THE INVENTION

1. Field of the Invention

This invention relates to a buffer circuit which can be used for the input stage of a semiconductor integrated circuit device, for example, and more particularly to a complementary buffer circuit having two buffer circuits connected in a complementary configuration.

2. Description of the Related Art

Generally, a buffer circuit is connected in the input stage of a semiconductor integrated circuit device. Various types of buffer circuits are known, and a differential amplification type buffer circuit may be used in a CMOS semiconductor integrated circuit device. This type of buffer circuit is used to convert an input signal of TTL (transistor transistor logic) level into a signal of CMOS logic level and supplies the converted signal to the internal circuit of the device. The differential amplification type buffer circuit includes a pair of driving MOS transistors and a current mirror circuit acting as the load of the MOS transistors. An input signal is supplied to the gate of one of the MOS transistors and a reference voltage is applied to the gate of the other MOS transistor. There are two types of buffer circuits, one type including a P-channel driving MOS transistor and a current mirror circuit formed of N-channel MOS transistors and the other type including an N-channel driving MOS transistor and a current mirror circuit formed of P-channel MOS transistors.

However, in the former type buffer circuit, the transition of an output signal from the high level to the low level tends to be delayed when the power source voltage is lowered by noise or the like. In contrast, in the latter type buffer circuit, the transition of an output signal from the low level to the high level tends to be delayed when the ground potential rises by noise or the reference potential is lowered.

As described above, when the rise or fall of an output signal of the buffer circuit is delayed and if a desired output level cannot be stably obtained, then the internal circuit of the device may be erroneously operated.

SUMMARY OF THE INVENTION

Accordingly, an object of this invention is to provide a buffer circuit which can be substantially stably operated irrespective of fluctuation in the power source voltage, ground potential and reference potential.

The above object can be attained by a buffer circuit comprising a first differential amplification type buffer circuit including a first MOS transistor of a first conductivity type having a source connected to a first potential supplying source and a gate applied with a reference potential, a second MOS transistor of the first conductivity type having a source connected to the first potential supplying source and a gate supplied with an input signal, and a first current mirror circuit including MOS transistors of a second conductivity type and connected between the drains of the first and second MOS transistors and a second potential supplying source; and a second differential amplification type buffer circuit including a third MOS transistor of the second conductivity type having a source connected to a second potential supplying source and a gate applied with the reference potential, a fourth MOS transistor of the second conductivity type having a source connected to the second potential supplying source, a drain connected to the drain of the second MOS transistor, and a gate supplied with the input signal, and a second current mirror circuit including MOS transistors of the first conductivity type connected between the drains of the third and fourth MOS transistors and the first potential supplying source; wherein an output signal is derived from a connection node between the drains of the second and fourth MOS transistors.

In the buffer circuit of the above construction, the inverting operation of the first differential amplification type buffer circuit from the first level to the second level may be delayed when the potential of the first potential supplying source is lowered. However, in this case, the second differential amplification type buffer circuit effects the normal operation and the inversion of the output level is not delayed so that the inversion of the output level in the overall circuit will not be delayed. In contrast, the inverting operation of the second differential amplification type buffer circuit from the second level to the first level may be delayed when the potential of the second potential supplying source is raised or the reference potential is lowered. However, in this case, the first differential amplification type buffer circuit effects the normal operation and the inversion of the output level is not delayed so that the inversion of the output level in the overall circuit will not be delayed. In this way, each of two differential amplification type buffer circuits with different constructions is operated to compensate for the defects of the other buffer circuit.

Thus, there is provided a buffer circuit which can be substantially stably operated irrespective of fluctuation in the power source voltage, ground potential reference potential.

BRIEF DESCRIPTION OF THE DRAWINGS

FIGS. 4 to 11 are circuit diagrams showing the constructions of buffer circuits according to second to ninth embodiments of this invention;

FIGS. 12A and 12B are circuit diagrams showing parts of the circuit of FIG. 11 to illustrate the operation of the circuit of FIG. 11;

FIG. 13 is a current-voltage characteristic diagram of the circuit shown in FIG. 12A;

FIG. 14 is a current-voltage characteristic diagram of the circuit shown in FIG. 12B;

FIG. 15 is a timing chart showing variation in an output signal waveform caused by change in the power source voltage level; and FIGS. 16 to 24 are circuit diagrams showing the constructions of buffer circuits according to tenth to eighteenth embodiments of this invention.

DETAILED DESCRIPTION OF THE PREFERRED EMBODIMENTS

Figure 1:
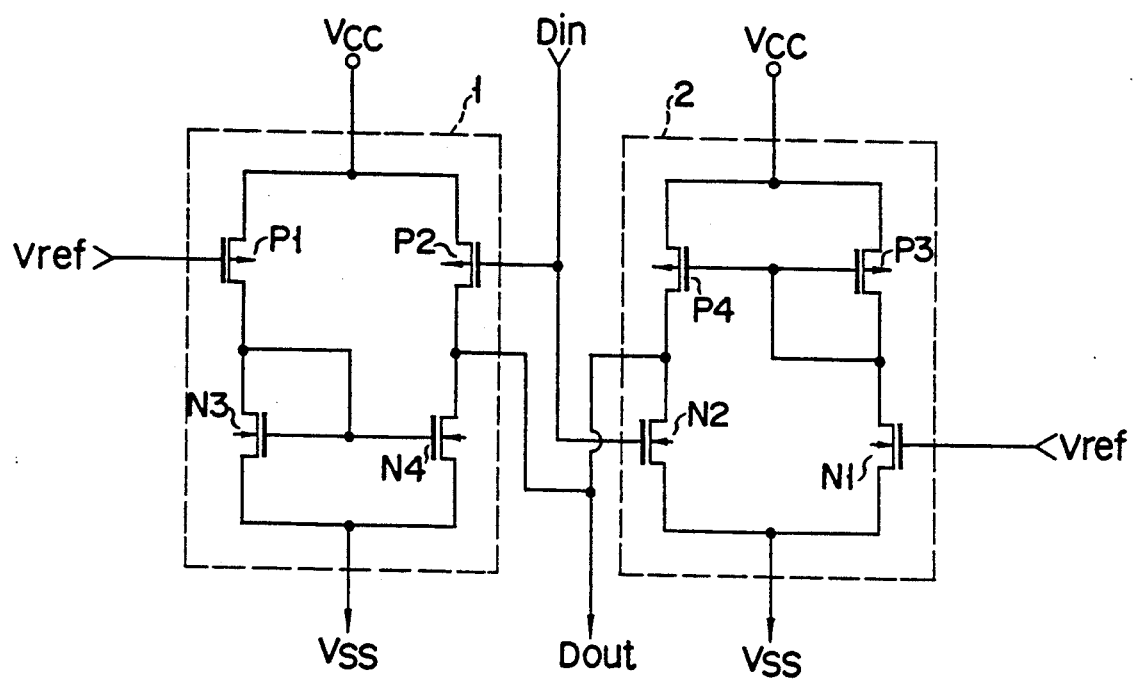
FIG. 1 is a circuit diagram showing the construction of a buffer circuit according to first embodiment of this invention.

FIG. 1 shows a buffer circuit according to one embodiment of this invention. The buffer circuit includes first and second differential amplification type buffer circuits 1 and 2. First differential amplification type buffer circuit 1 includes a pair of driving P-channel MOS transistors P1 and P2 and N-channel MOS transistors N3 and N4 acting as the loads of MOS transistors P1 and P2 and connected to constitute a current mirror circuit. Second differential amplification type buffer circuit 2 includes P-channel MOS transistors P3 and P4 acting as loads and connected to constitute a current mirror circuit and a pair of driving N-channel MOS transistors N1 and N2. That is, the source of MOS transistor P1 is connected to first potential supplying source Vcc and the gate thereof is applied with reference potential Vref. The source of MOS transistor P2 is connected to first potential supplying source Vcc and the gate thereof is supplied with input signal Din. The current path between the drain and source of MOS transistor N3 is connected between the drain of MOS transistor P1 and second potential supplying source (ground terminal) Vss. The current path between the drain and source of MOS transistor N4 is connected between the drain of MOS transistor P2 and second potential supplying source (ground terminal) Vss. The gates of MOS transistors N3 and N4 are commonly connected and the commonly connected node is connected to the drain of MOS transistor N3. The sources of MOS transistors P3 and P4 are connected to first potential supplying source Vcc and the gates thereof are commonly connected to the drain of MOS transistor P3. The current path between the drain and source of MOS transistor N1 is connected between the drain of MOS transistor P3 and second potential supplying source Vss and the gate thereof is applied with reference potential Vref. The current path between the drain and source of MOS transistor N2 is connected between the drain of MOS transistor P4 and second potential supplying source Vss and the gate thereof is connected to the gate of MOS transistor P2. The gate common connection node (input node) between the gates of MOS transistors P2 and N2 is supplied with input signal Din. The drain common connection node between the drains of MOS transistors P2 and N4 is connected to the drain common connection node between the drains of MOS transistors P4 and N2 and output signal Dout is derived out from the common connection node (output node).

Figure 2:
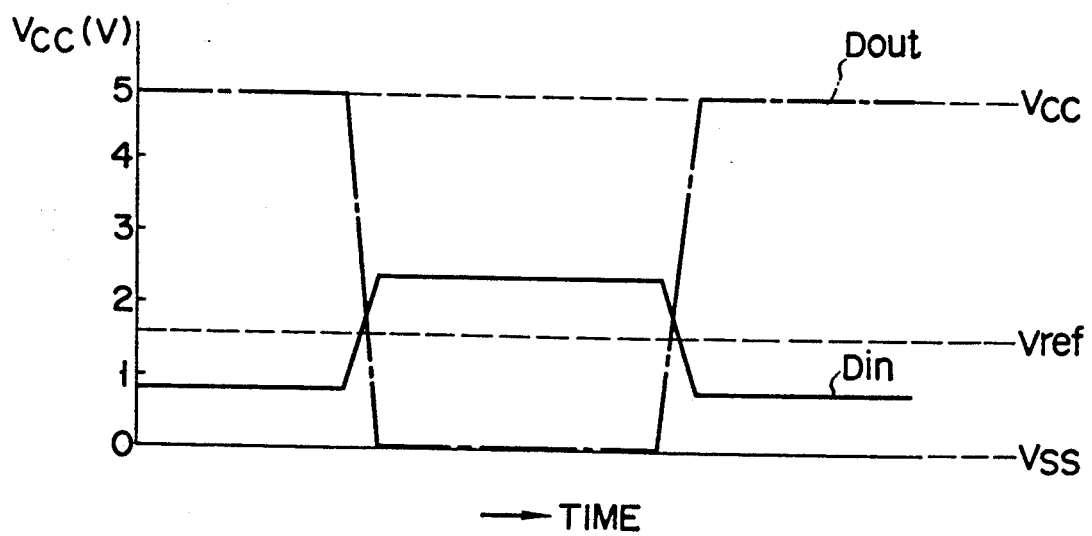
FIG. 2 is a timing chart illustrating the normal operation of the circuit shown in FIG. 1.

Now, the operation of the buffer circuit shown in FIG. 1 is explained with reference to FIG. 2. In FIG. 2, the relation between input signal Din and output signal Dout is shown with a voltage of first potential supplying source Vcc set at 5 V, a voltage of second potential supplying source Vss set at 0 V and reference potential Vref set at 1.6 V. When input signal Din of TTL level is shifted from low level "L" to high level "H", the conductance of MOS transistor P2 is reduced in first differential amplification type buffer circuit 1. When the conductance of MOS transistor P2 becomes smaller than that of MOS transistor N4, an output signal of circuit 1 is changed from "H" level (Vcc level) to "L" level (Vss level). At this time, the conductance of MOS transistor N2 increases in second differential amplification type buffer circuit 2 and when it becomes larger than that of MOS transistor P4, an output signal of circuit 2 is changed from "H" level to "L" level. In this way, output signal Dout of the buffer circuit shown in FIG. 1 is rapidly inverted from "H" level to "L" level.

In contrast, when input signal Din is changed from "H" level to "L" level, the conductance of MOS transistor P2 increases in first differential amplification type buffer circuit 1. When the conductance of MOS transistor P2 becomes larger than that of MOS transistor N4, an output signal of circuit 1 is changed from "L" level to "H" level. At this time, the conductance of MOS transistor N2 decreases in second differential amplification type buffer circuit 2 and when it becomes smaller than that of MOS transistor P4, an output signal of circuit 2 is changed from "L" level to "H" level. In this way, output signal Dout of the buffer circuit shown in FIG. 1 is rapidly inverted from "L" level to "H" level.

Figure 3:
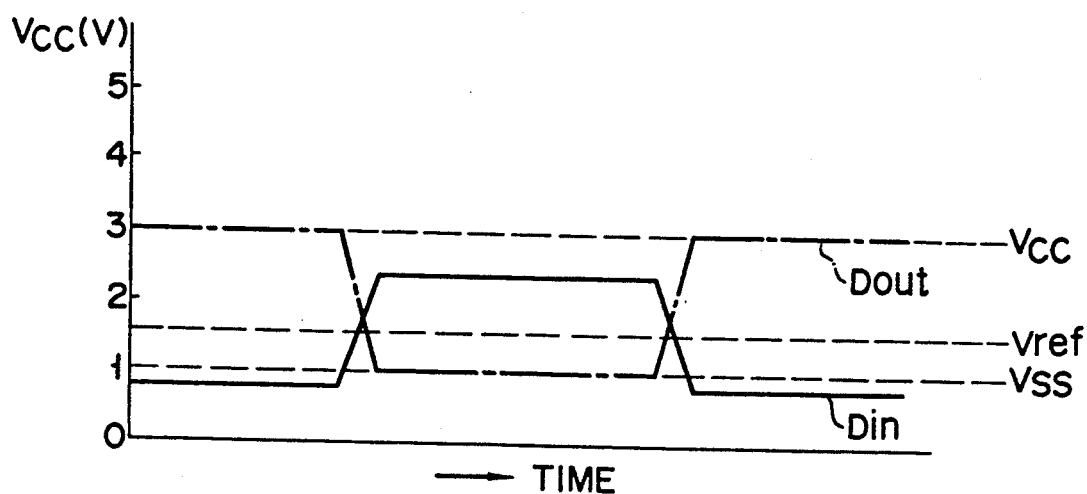
FIG. 3 is a timing chart showing the operation of the circuit shown in FIG. 1 in a case where the power source voltage is lowered and the ground potential is raised.

There will now be explained, with reference to FIG. 3, the operation of the above buffer circuit effected in a case where the Vcc and Vss voltages are significantly changed, for example, in such a bad condition that Vcc=3 V, Vss=1 V and Vref=1.6 V. When input signal Din of TTL level is changed from "L" level to "H" level, an output signal of first differential amplification type buffer circuit 1 is changed from "H" level to "L" level with a delay. At this time, however, the speed of transition of an output signal of second differential amplification type buffer circuit 2 from "H" level to "L" level is not lowered, compensating for the delay and therefore output signal Dout can be inverted without delay.

Further, when input signal Din of TTL level is changed from "H" level to "L" level, an output signal of second differential amplification type buffer circuit 2 is changed from "L" level to "H" level with a delay. At this time, however, the speed of transition of an output signal of first differential amplification type buffer circuit 1 from "L" level to "H" level is not lowered, compensating for the delay and therefore output signal Dout can be inverted without delay.

When reference potential Vref is lowered, the transition speed of an output signal of second differential amplification type buffer circuit 2 from "L" level to "H" level is lowered in the same manner as in the case where ground potential Vss is raised. However, the transition speed of an output signal of first differential amplification type buffer circuit 1 from "L" level to "H" level is not lowered so that the inversion speed of output signal Dout will not be lowered.

FIGS. 4 to 11 and 16 to 24 show buffer circuits according to second to eighteenth embodiments of this invention. The operation of the circuits of FIGS. 4 to 10 is controlled by control signals (or clock signals) $\phi$ and $\bar{\phi}$. The circuits shown in FIGS. 11 and 16 to 24 are designed to enhance the sensitivity. The above circuits are explained in detail below.

Figure 4:
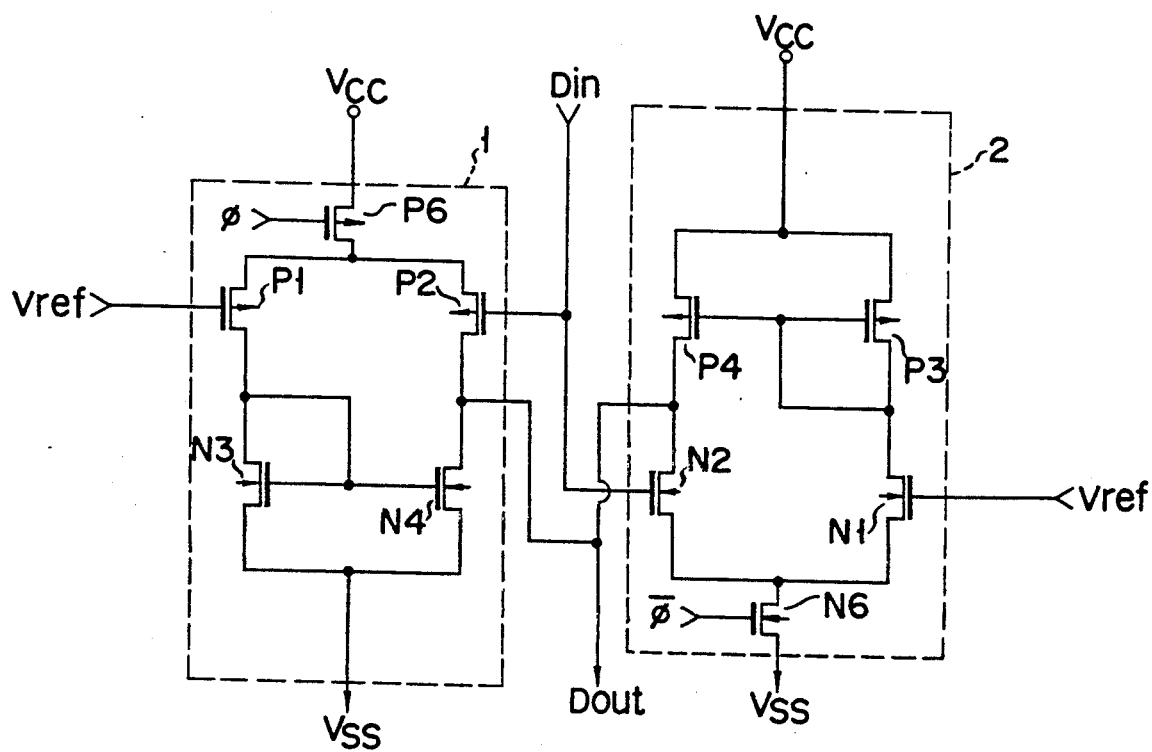

In the buffer circuit shown in FIG. 4, the current path between the drain and source of P-channel MOS transistor P6 is connected between the source common connection node of MOS transistors P1, P2 in the circuit of FIG. 1 and first potential supplying source Vcc. Control signal $\phi$ is supplied to the gate of MOS transistor P6 to control the conduction state thereof. MOS transistor P6 is used for controlling the operation of first differential amplification type buffer circuit 1. Further, the current path between the drain and source of N-channel MOS transistor N6 is connected between the source common connection node of MOS transistors N1, N2 in the circuit of FIG. 1 and second potential supplying source Vss. Control signal $\bar{\phi}$ is supplied to the gate of MOS transistor N6 to control the conduction state thereof. MOS transistor N6 is used for controlling the operation of second differential amplification type buffer circuit 2.

With the above construction, when control signal $\phi$ is at "H" level and control signal $\bar{\phi}$ is at "L" level, MOS transistors P6 and N6 are both turned on to set first and second differential amplification type buffer circuits 1 and 2 active. In this condition, the circuit of FIG. 4 is operated in the same manner as the buffer circuit shown in FIG. 1. In contrast, when control signal $\phi$ is at "L" level and control signal $\bar\phi$ is at "H" level, MOS transistors P6 and N6 are both turned off to set first and second differential amplification type buffer circuits 1 and 2 non-operative. In this condition, since the circuit paths from first potential supplying source Vcc to second potential supplying source Vss in buffer circuits 1 and 2 are cut off by MOS transistors P6 and N6, the power consumption can be reduced.

When clock signals are used as control signals $\phi$ and $\bar\phi$, the buffer circuit of FIG. 4 is operated in synchronism with the clock signals.

As described above, the buffer circuit with the construction shown in FIG. 4 is operated in basically the same manner as the circuit of FIG. 1 and the same effect can be attained. Further, in the circuit of FIG. 4, the power consumption of the buffer circuit set in the non-operative state can be reduced. In the circuits shown in FIGS. 5 to 11, the operation of the buffer circuit is controlled by control signals $\phi$ and/or $\bar\phi$ in substantially the same manner as in the circuit of FIG. 4. The circuits are different from one another in the position where the operation controlling MOS transistors are provided.

In the buffer circuit shown in FIG. 5, the current path between the drain and source of N-channel MOS transistor N5 is connected between the source common connection node of MOS transistors N3, N4 in the circuit of FIG. 1 and second potential supplying source Vss. Control signal $\phi$ is supplied to the gate of MOS transistor N5 to control the conduction state thereof. MOS transistor N5 is used for controlling the operation of first differential amplification type buffer circuit 1. Further, the current path between the drain and source of P-channel MOS transistor P5 is connected between the source common connection node of MOS transistors P3, P4 and first potential supplying source Vcc. Control signal $\bar\phi$ is supplied to the gate of MOS transistor P5 to control the conduction state thereof. MOS transistor P5 is used for controlling the operation of second differential amplification type buffer circuit 2.

The circuit with the construction of FIG. 5 is operated in basically the same manner as the circuit of FIG. 4 and the same effect can be obtained.

Figure 6:
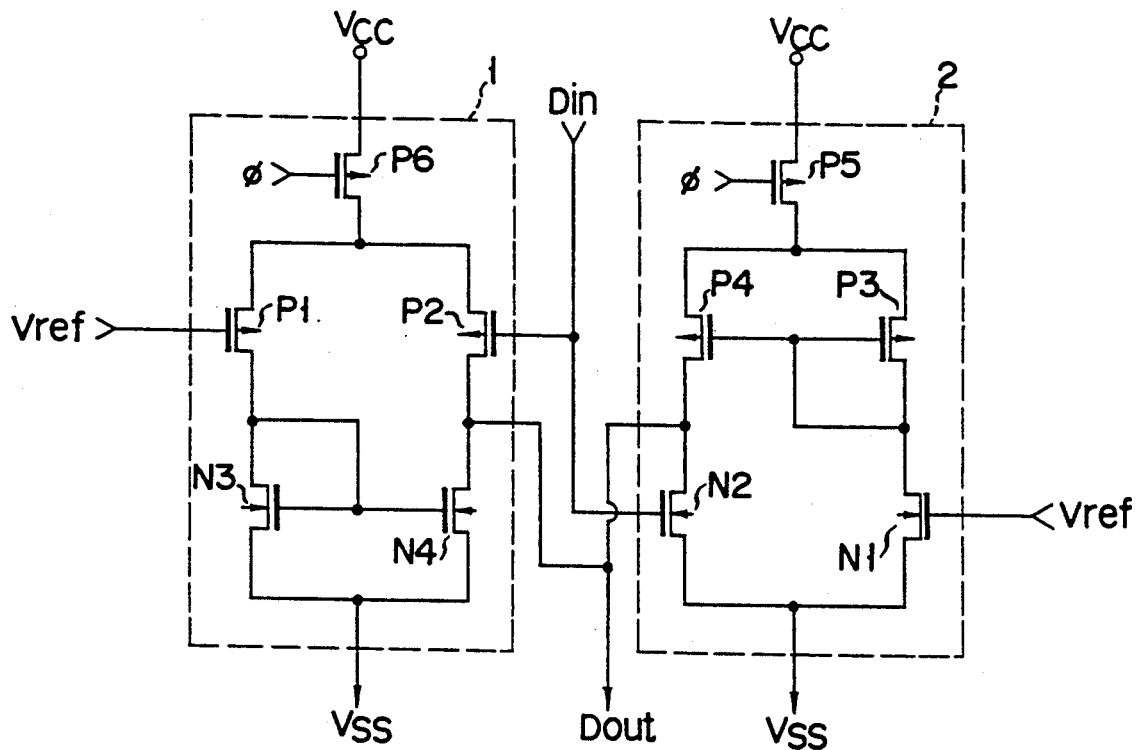

In the buffer circuit of FIG. 6, the current path between the drain and source of P-channel MOS transistor P6 is connected between the source common connection node of MOS transistors P1, P2 and first potential supplying source Vcc. Further, the current path between the drain and source of P-channel MOS transistor P5 is connected between the source common connection node of MOS transistors P3, P4 and first potential supplying source Vcc. Control signal $\bar\phi$ is supplied to the gates of MOS transistors P6 and P5 to control the conduction states thereof. MOS transistors P6 and P5 are used for controlling the operation of first and second differential amplification type buffer circuits 1 and 2.

Figure 7:
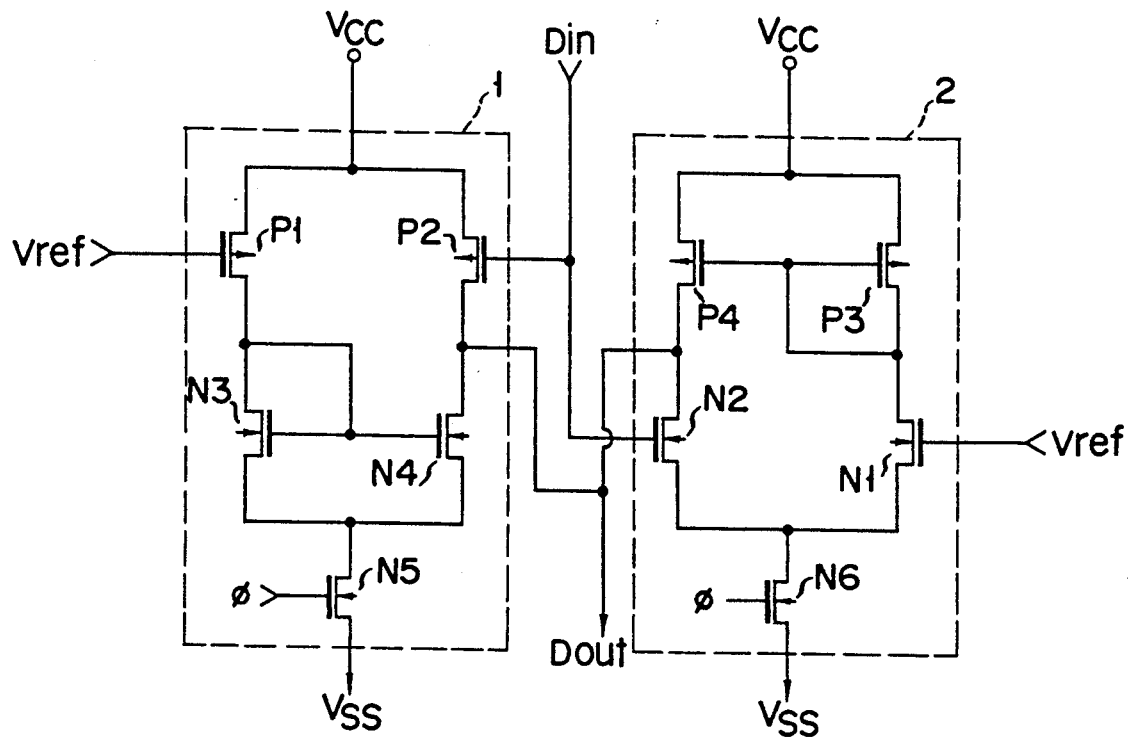
Figure 8:
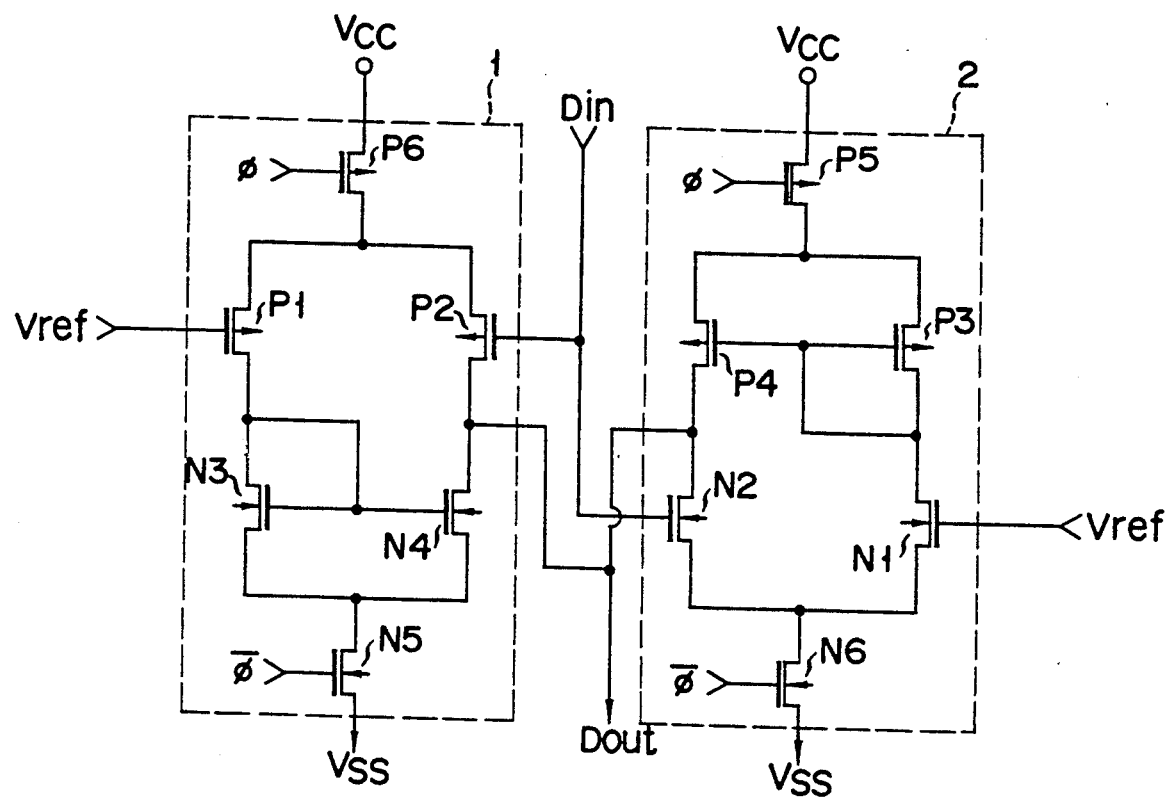

In the buffer circuit of FIG. 7, the current path between the drain and source of N-channel MOS transistor N5 is connected between the source common connection node of MOS transistors N3, N4 and second potential supplying source Vss. Further, the current path between the drain and source of N-channel MOS transistor N6 is connected between the source common connection node of MOS transistors N1, N2 and second potential supplying source Vss. Control signal $\phi$ is supplied to the gates of MOS transistors N5 and N6 to control the conduction states thereof. MOS transistors N5 and N6 are used for controlling the operation of first and second differential amplification type buffer circuits 1 and 2.

The circuit with the construction shown in FIG. 6 or 7 is operated in basically the same manner as the circuit shown in FIG. 4 or 5 and substantially the same effect can be obtained. Further, the constructions of FIGS. 4 and 5 or those of FIGS. 6 and 7 can be combined to obtain the construction shown in FIG. 8.

Figure 9:
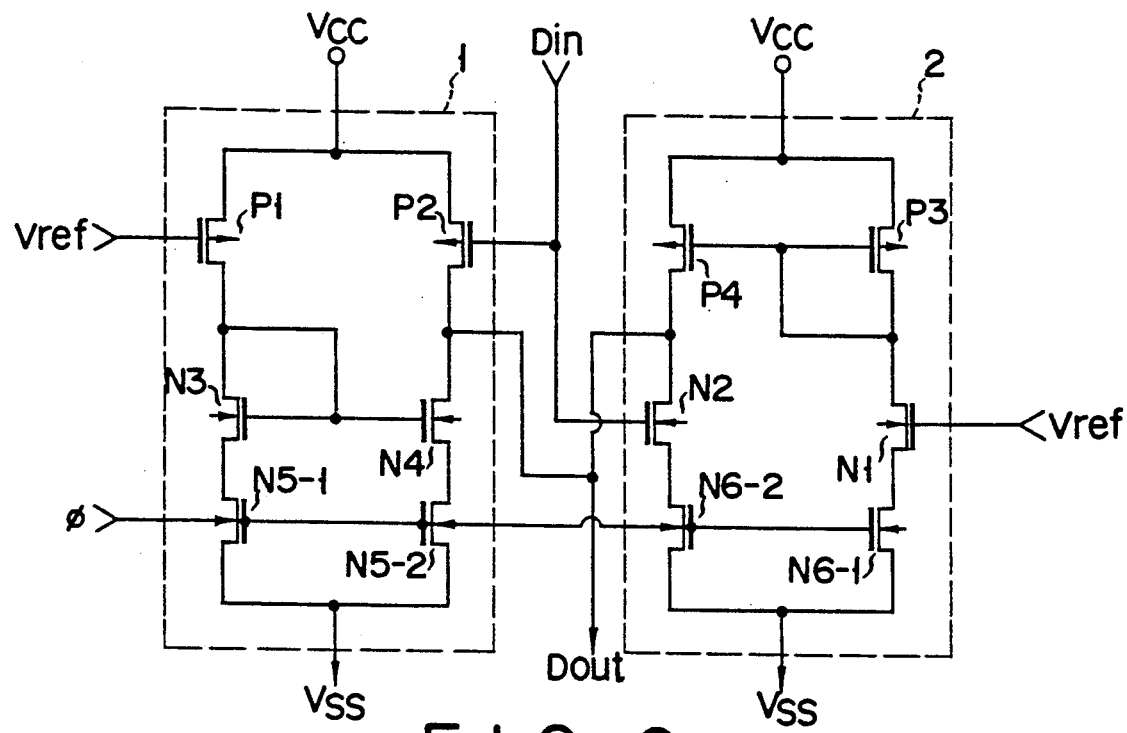

In the buffer circuit of FIG. 9, the current path between the drain and source of N-channel MOS transistor N5-1 is connected between the source of MOS transistor N3 and second potential supplying source Vss. Further, the current path between the drain and source of N-channel MOS transistor N5-2 is connected between the source of MOS transistor N4 and second potential supplying source Vss. The current path between the drain and source of N-channel MOS transistor N6-1 is connected between the source of MOS transistor N1 and second potential supplying source Vss. Further, the current path between the drain and source of N-channel MOS transistor N6-2 is connected between the source of MOS transistor N2 and second potential supplying source Vss. Control signal $\phi$ is supplied to the gates of MOS transistors N5-1, N5-2, N-6-1 and N6-2 to control the conduction states thereof. MOS transistors N5-1 and N5-2 are used for controlling the operation of first differential amplification type buffer circuit 1 and MOS transistors N6-1 and N6-2 are used for controlling the operation of second differential amplification type buffer circuit 2.

With the above construction, since MOS transistors N5-1, N5-2, N6-1 and N6-2 are set in the conductive state when control signal $\phi$ is set at "H" level, first and second differential amplification type buffer circuits 1 and 2 are set into the active state. In contrast, since MOS transistors N5 1, N5-2, N6-1 and N6-2 are set in the non-conductive state when control signal $\phi$ is set at "L" level, first and second differential amplification type buffer circuits 1 and 2 are set into the non-operative state.

Figure 10:
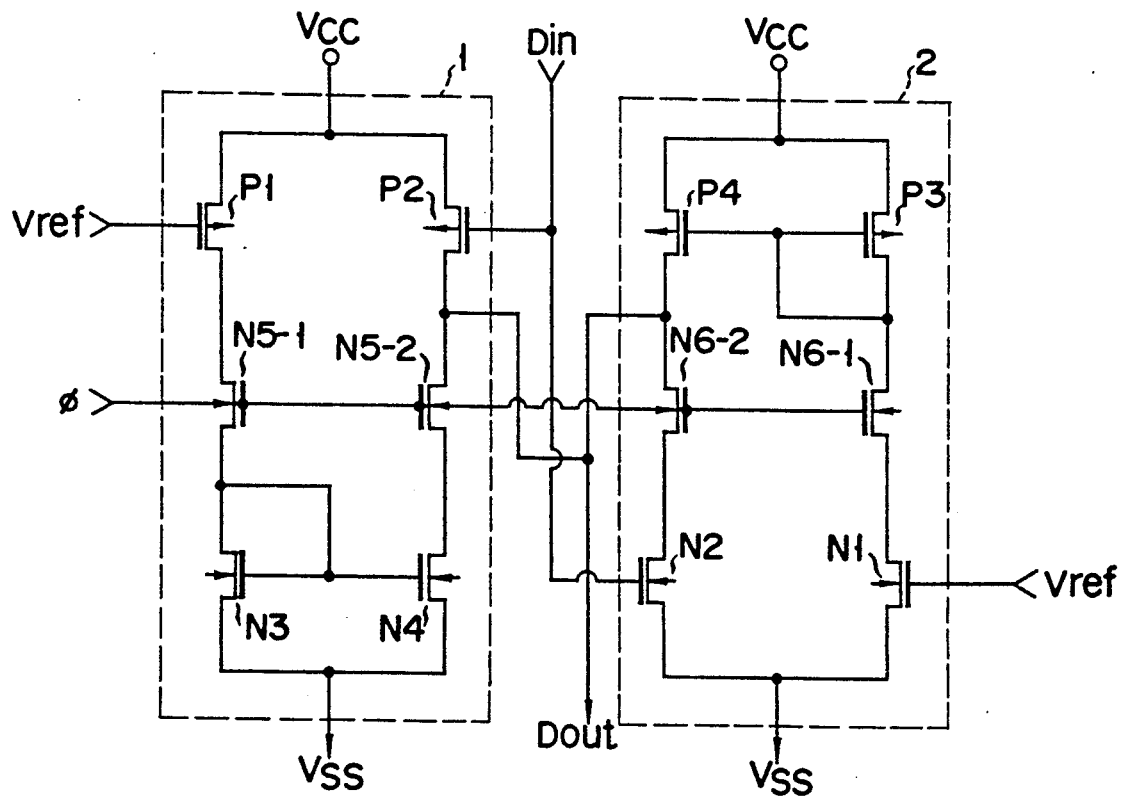

In the buffer circuit shown in FIG. 10, the current path between the drain and source of N-channel MOS transistor N5-1 is connected between the drains of MOS transistors P1 and N3. Further, the current path between the drain and source of N-channel MOS transistor N5-2 is connected between the drains of MOS transistors P2 and N4. The current path between the drain and source of N-channel MOS transistors N6-1 is connected between the drains of MOS transistors P3 and N1. Further, the current path between the drain and source of N-channel MOS transistor N6-2 is connected between the source of MOS transistors P4 and N2. Control signal $\phi$ is supplied to the gates of MOS transistors N5-1, N5-2, N6-1 and N6-2 to control the conduction states thereof.

With the above construction, when control signal $\phi$ is set at "H" 60 level, first and second differential amplification type buffer circuits 1 and 2 are set into the active state and effect substantially the same operation as in the former embodiments. In contrast, when control signal $\phi$ is set at "L" level, first and second differential amplification type buffer circuits 1 and 2 are set into the non-operative state.

The buffer circuits of the constructions shown in FIGS. 9 and 10 perform substantially the same operation as that of the circuits of the former embodiments and the same effect as in the former embodiments can be attained.

In the buffer circuit of FIG. 11, the current path between the drain and source of P channel MOS transistor P6 is connected between the source common connection node of MOS transistors P1, P2 and first potential supplying source Vcc. Second potential supplying source Vss is connected to the gate of MOS transistor P6 to keep MOS transistor P6 in the conductive state. MOS transistor P6 acts as a load and is used to enhance the sensitivity of first differential amplification type buffer circuit 1. Further, the current path between the drain and source of N-channel MOS transistor N6 is connected between the source common connection node of MOS transistors N1, N2 and second potential supplying source Vss. First potential supplying source Vcc is connected to the gate of MOS transistor N6 to keep MOS transistor N6 in the conductive state. MOS transistor N6 acts as a load and is used to enhance the sensitivity of second differential amplification type buffer circuit 2.

With the above construction, MOS transistors P6 and N6 act as a resistor. The source potential of MOS transistors P1 and P2 is set at "Vcc-Vp6" and the potential of MOS transistors N1 and N2 is set at "Vss+Vn6". In this case, Vp6 indicates a voltage drop caused in MOS transistor P6 by the turn-on resistance thereof, and Vn6 indicates a stepped-up voltage caused by the turn-on resistance of MOS transistor N6. Thus, substantially the same effect as that obtained by lowering power source voltage Vcc of first differential amplification type buffer circuit 1 in the circuit of FIG. 1 and raising ground potential Vss of second differential amplification type buffer circuit 2 can be obtained. As a result, the sensitivity of the buffer circuit can be improved and the buffer circuit can be operative in response to the slightest variation in input signal Din.

The improvement in the sensitivity is explained with reference to FIGS. 12A, 12B and 13 to 15. FIGS. 12A and 12B discretely show portions of first differential amplification type buffer circuit 1 in the circuit of FIG. 11. The voltage-current characteristic of the circuit shown in FIG. 12A is shown in FIG. 13. Since the same current i0 flows in MOS transistors P1 and N3 in the circuit of FIG. 12A, the intersection of solid lines 11 (the voltage-current characteristic of MOS transistor P1) and 12 (the voltage-current characteristic of MOS transistor N3) corresponds to output voltage V0. The voltage-current characteristic of MOS transistor P1 obtained when the power source voltage is at Vcc level is shown in broken line 13, and the intersection of broken line 13 and solid line 12 indicates output voltage V0' obtained when the power source voltage is at Vcc level.

FIG. 14 shows the voltage-current characteristic of the circuit shown in FIG. 12B whose operation is controlled by output voltage V0 of the circuit shown in FIG. 12A. Solid lines 14-1 to 14-4 indicate the voltage-current characteristics of MOS transistor P2 with respect to variation in input signal Din. Solid line 15 indicates the voltage-current characteristic of MOS transistor N4 obtained when the power source voltage is set at "Vcc-Vp6" and broken line 16 indicates the voltage-current characteristic of MOS transistor N4 obtained when the power source voltage is set at Vcc level. Like the circuit of FIG. 12A, a voltage obtained when current flowing in MOS transistor P2 becomes equal to that flowing in MOS transistor N4 becomes output signal Dout.

FIG. 15 shows the waveforms of output signal Dout obtained when the power source voltage is at Vcc level and at "Vcc-Vp6". The buffer circuit is operate in response to input signal Din at an earlier timing when the power source voltage is set at "Vcc-Vp6" as shown by solid line 17 than when the power source voltage is set at Vcc level as indicated by broken line 18.

Second differential amplification type buffer circuit 2 is similar to first differential amplification type buffer circuit 1 except the conductivity types of MOS transistors used therein and substantially the same characteristic as in first differential amplification type buffer circuit 1 can be obtained in second differential amplification type buffer circuit. Therefore, the buffer circuit shown in FIG. 11 can be operated in response to slight variation in input signal Din with a higher sensitivity in comparison with the circuits of the embodiments shown in FIGS. 1 to 8. Thus, the sensitivity can be enhanced.

The same effect as described above can be obtained by adding N-channel MOS transistor N5 to first differential amplification type buffer circuit 1 and adding P-channel MOS transistor P5 to second differential amplification type buffer circuit 2 as shown in FIG. 16. It is also possible to add P-channel MOS transistor P6 and N-channel MOS transistor N5 to first differential amplification type buffer circuit 1 and add P-channel MOS transistor P5 and N-channel MOS transistor N6 to second differential amplification type buffer circuit 2 as shown in FIG. 17. Further, as shown in FIG. 18, resistors R1 and R2 can be used instead of MOS transistors P6 and N6. Likewise, as shown in FIG. 19, resistors R4 and R3 can be used instead of MOS transistors N5 and P5, and as shown in FIG. 20, resistors R1, R2, R4 and R3 can be used instead of MOS transistors P6, N6, N5 and P6, respectively. Further, as shown in FIGS. 21 to 23, diodes D1 to D4 can be used instead of resistors R1 to R4.

In the circuit of FIG. 24, the gate of MOS transistors P6 shown in FIG. 11 is connected to the drain common connection node of MOS transistors P1 and N3. The gate of MOS transistors N6 is connected to the drain common connection node of MOS transistors P3 and N1. In this case, MOS transistors P6 and N6 act as loads.

The buffer circuits of the construction shown in FIGS. 16 to 24 operate in basically the same manner as the circuit shown in FIG. 11 and the sensitivity can be enhanced.

As described above, according to the buffer circuit of this invention, since the rise or fall of an output signal is not influenced by variation in power source voltages Vcc and Vss and reference potential Vref, the operation speed will not be lowered by variation in the potentials, the output level can be stabilized, and the internal circuit of the device can be prevented from being erroneously operated.

What is claimed is:
1. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors; and
a second current mirror circuit including MOS transistors of the first conductivity type and connected between the drains of said third and fourth MOS transistors and said first potential supplying source, wherein the second current mirror circuit is not connected in series with the first current mirror circuit.

2. A buffer circuit according to claim 1, wherein said first current mirror circuit includes a fifth MOS transistor of the second conductivity type whose drain and gate are connected to the drain of said first MOS transistor and whose source is connected to said second potential supplying source and a sixth MOS transistor of the second conductivity type having a drain connected to the drain of said second MOS transistor, a source connected to said second potential supplying source and a gate connected to the gate of said fifth MOS transistor.

3. A buffer circuit according to claim 1, wherein said second current mirror circuit includes a fifth MOS transistor of the first conductivity type whose source is connected to said first potential supplying source and whose drain and gate are connected to the drain of said third MOS transistor and a sixth MOS transistor of the first conductivity type having a source connected to said first potential supplying source, a drain connected to the drain of said fourth MOS transistor and a gate connected to the gate of said seventh MOS transistor.

4. A buffer circuit according to claim 1, wherein the voltage of said second potential supplying source is at a ground potential level, the voltage of said first potential supplying source is set at a power source voltage level higher than the ground potential level, and the reference potential is set at a potential level between the power source voltage level and ground potential level.

5. A buffer circuit according to claim 1, wherein said input signal is set at a TTL level and said output signal is set at a CMOS logic level.

6. A buffer circuit according to claim 1, wherein said MOS transistor of the first conductivity type is a P-channel MOS transistor and said MOS transistor of the second conductivity type is an N-channel MOS transistor.

7. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;
a second current mirror circuit including MOS transistors of the first conductivity type and connected between the drains of said third and fourth MOS transistors and said first potential supplying source;
first switching means which is connected between said first potential supplying source and the sources of said first and second MOS transistors and whose conduction state is controlled in response to a control signal; and
second switching means which is connected between said second potential supplying source and the sources of said third and fourth MOS transistors and whose conduction state is controlled in response to the control signal.

8. A buffer circuit according to claim 7, wherein said first switching means includes a MOS transistor of the first conductivity type and said second switching means includes a MOS transistor of the second conductivity type.

9. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;

a second current mirror circuit including MOS transistors of the first conductivity type and connected between the drains of said third and fourth MOS transistors and said first potential supplying source;

first switching means which is connected between said first potential supplying source and said second current mirror circuit and whose conduction state is controlled in response to a control signal; and second switching means which is connected between said second potential supplying source and said first current mirror circuit and whose conduction state is controlled in response to the control signal.

10. A buffer circuit according to claim 9, wherein said first switching means includes a MOS transistor of the first conductivity type and said second switching means includes a MOS transistor of the second conductivity type.

11. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;
a second current mirror circuit including MOS transistors of the first conductivity type and connected between the drains of said third and fourth MOS transistors and said first potential supplying source;
first switching means which is connected between said first potential supplying source and the sources of said first and second MOS transistors and whose conduction state is controlled in response to a control signal; and
second switching means which is connected between said first potential supplying source and said second current mirror circuit and whose conduction state is controlled in response to the control signal.

12. A buffer circuit according to claim 11, wherein said first and second switching means each include a MOS transistor of the first conductivity type.

13. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;
a second current mirror circuit including MOS transistors of the first conductivity type and connected between the drains of said third and fourth MOS transistors and said first potential supplying source;
first switching means which is connected between said second potential supplying source and said first current mirror circuit and whose conduction state is controlled in response to a control signal; and
second switching means which is connected between said second potential supplying source and the sources of said third and fourth MOS transistors and whose conduction state is controlled in response to the control signal.

14. A buffer circuit according to claim 13, wherein said first and second switching means each include a MOS transistor of the second conductivity type.

15. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;
a second current mirror circuit including MOS transistors of the first conductivity type and connected between the drains of said third and fourth MOS transistors and said first potential supplying source;

first switching means which is connected between said first potential supplying source and the sources of said first and second MOS transistors and whose conduction state is controlled in response to a control signal;

second switching means which is connected between said second potential supplying source and said first current mirror circuit and whose conduction state is controlled in response to an inverted signal of the control signal;

third switching means which is connected between said first potential supplying source and said second current mirror circuit and whose conduction state is controlled in response to the control signal; and fourth switching means which is connected between said second potential supplying source and the sources of said third and fourth MOS transistors and whose conduction state is controlled in response to the inverted signal of the control signal.

16. A buffer circuit according to claim 15, wherein said first and third switching means each include a MOS transistor of the first conductivity type and said second and fourth switching means each include a MOS transistor of the second conductivity type.

17. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;
a second current mirror circuit including MOS transistors of the first conductivity type and connected between the drains of said third and fourth MOS transistors and said first potential supplying source;
first load means connected between said first potential supplying source and the sources of said first and second MOS transistors; and
second load means connected between said second potential supplying source and the sources of said third and fourth MOS transistors.

18. A buffer circuit according to claim 17, wherein said first load means includes a MOS transistor of the first conductivity type having a source connected to said first potential supplying source, a drain connected to the sources of said first and second MOS transistors and a gate connected to said second potential supplying source and said second load means includes a MOS transistor of the second conductivity type having a source connected to said second potential supplying source, a drain connected to the sources of said third and fourth MOS transistors and a gate connected to said first potential supplying source.

19. A buffer circuit according to claim 17, wherein said first load means includes a first resistor connected at one end to said first potential supplying source and connected at the other end to the sources of said first and second MOS transistors and said second load means includes a second resistor connected at one end to said second potential supplying source and connected at the other end to the sources of said third and fourth MOS transistors.

20. A buffer circuit according to claim 17, wherein said first load means includes a first diode having an anode connected to said first potential supplying source and a cathode connected to the sources of said first and second MOS transistors and said second load means includes a second diode having a cathode connected to second potential supplying source and an anode connected to the sources of said third and fourth MOS transistors.

21. A buffer circuit according to claim 17, wherein said first load means includes a MOS transistor of the first conductivity type having a source connected to said first potential supplying source, a drain connected to the sources of said first and second MOS transistors and a gate connected to the drain of said first MOS transistor and said second load means includes a MOS transistor of the second conductivity type having a source connected to said second potential supplying source, a drain connected to the source of said third and fourth MOS transistors and a gate connected to the drain of said third MOS transistor.

22. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;
a second current mirror circuit including MOS transistors of the first conductivity type and connected between the drains of said third and fourth MOS transistors and said first potential supplying source;
first load means connected between said first potential supplying source and said second current mirror circuit; and
second load means connected between said second potential supplying source and said first current mirror circuit.

23. A buffer circuit according to claim 22, wherein said first load means includes a MOS transistor of the first conductivity type having a source connected to said first potential supplying source, a drain connected to said second current mirror circuit and a gate connected to said second potential supplying source and said second load means includes a MOS transistor of the second conductivity type having a source connected to said second potential supplying source, a drain connected to said first current mirror circuit and a gate connected to said first potential supplying source.

24. A buffer circuit according to claim 22, wherein said first load means includes a first resistor connected at one end to said first potential supplying source and connected at the other end to said second current mirror circuit and said second load means includes a second resistor connected at one end to said second potential supplying source and connected at the other end to said first current mirror circuit.

25. A buffer circuit according to claim 22, wherein said first load means includes a first diode having an anode connected to said first potential supplying source and a cathode connected to said second current mirror circuit and said second load means includes a second diode having an anode connected to said first mirror circuit and a cathode connected to said second potential supplying source.

26. A buffer circuit comprising:
a first potential supplying source;
a first MOS transistor of a first conductivity type having a source connected to said first potential supplying source and a gate supplied with a reference potential;
a second MOS transistor of the first conductivity type having a source connected to said first potential supplying source and a gate supplied with an input signal;
a second potential supplying source;
a first current mirror circuit including MOS transistors of a second conductivity type and connected between the drains of said first and second MOS transistors and said second potential supplying source;
a third MOS transistor of the second conductivity type having a source connected to said second potential supplying source and a gate supplied with the reference potential;
a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;
a second current mirror circuit including MOS transistors of the first conductivity type and connected between the drains of said third and fourth MOS transistors and said first potential supplying source;
first load means connected between said first potential supplying source and the sources of said first and second MOS transistors;
second load means connected between said second potential supplying source and said first current mirror circuit;
third load means connected between said first potential supplying source and said second current mirror circuit; and
fourth load means connected between said second potential supplying source and the sources of said third and fourth MOS transistors.

27. A buffer circuit according to claim 26, wherein said first load means includes a first load MOS transistor of the first conductivity type having a source connected to said first potential supplying source, a drain connected to the sources of said first and second MOS transistors and a gate connected to said second potential supplying source; said second load means includes a second load MOS transistor of the second conductivity type having a source connected to said second potential supplying source, a drain connected to said first current mirror circuit and a gate connected to said first potential supplying source; said third load means includes a third load MOS transistor of the first conductivity type having a source connected to said first potential supplying source, a drain connected to said second current mirror circuit and a gate connected to said second potential supplying source; and said fourth load means includes a fourth load MOS transistor of the second conductivity type having a source connected to said second potential supplying source, a drain connected to the sources of said third and fourth MOS transistors and a gate connected to said first potential supplying source.

28. A buffer circuit according to claim 26, wherein said first load means includes a first resistor connected at one end to said first potential supplying source and connected at the other end to the sources of said first and second MOS transistors; said second load means includes a second resistor connected at one end to said second potential supplying source and connected at the other end to said first current mirror circuit; said third load means includes a third resistor connected at one end to said first potential supplying source and connected at the other end to said second current mirror circuit; and said fourth load means includes a second resistor connected at one end to said second potential supplying source and connected at the other end to the sources of said third and fourth MOS transistors.

29. A buffer circuit according to claim 26, wherein said first load means includes a first diode having an anode connected to said first potential supplying source and a cathode connected to the sources of said first and second MOS transistors; said second load means includes a second diode having an anode connected to said first current mirror circuit and a cathode connected to said second potential supplying source; said third load means includes a third diode having an anode connected to said first potential supplying source and a cathode connected to said second current mirror circuit; and said fourth load means includes a fourth diode having a cathode connected to said first potential supplying source and an anode connected to the sources of said third and fourth MOS transistors.

30. A buffer circuit comprising:
a first potential supplying source;
a first MOS transistor of a first conductivity type having a source connected to said first potential supplying source and a gate supplied with a reference potential;

a second MOS transistor of the first conductivity type having a source connected to said first potential supplying source and a gate supplied with an input signal;

a second potential supplying source;

a first current mirror circuit including MOS transistors of a second conductivity type and connected between the drains of said first and second MOS transistors and said second potential supplying source;

a third MOS transistor of the second conductivity type having a source connected to said second potential supplying source and a gate supplied with the reference potential;

a fourth MOS transistor of the second conductivity type having a source connected to said second potential supplying source, a drain connected to the drain of said second MOS transistor and a gate supplied with the input signal, an output signal being derived from a connection node between the drains of said second and fourth MOS transistors;

a second current mirror circuit including MOS transistors of the first conductivity type and connected between the drains of said third and fourth MOS transistors and said first potential supplying source;

first switching means connected between the drains of said first and second MOS transistors and said first current mirror circuit; and second switching means connected between said second current mirror circuit and the drains of said third and fourth MOS transistors.

31. A buffer circuit according to claim 30, wherein said first switching means includes a first switching MOS transistor whose drain is connected to the drain of said first MOS transistor and whose source is connected to the gate of one of the MOS transistors constituting said first current mirror circuit and whose conduction state is controlled by a control signal and a second switching MOS transistor whose drain is connected to the drain of said second MOS transistor and whose source is connected to the drain of the other of the MOS transistors constituting said first current mirror circuit and whose conduction state is controlled by the control signal; and said second switching means includes a third switching MOS transistor whose source is connected to the drain of said third MOS transistor and whose drain is connected to the drain of one of the MOS transistors constituting said second current mirror circuit and whose conduction state is controlled by a control signal and a fourth switching MOS transistor whose source is connected to the drain of said fourth MOS transistor and whose drain is connected to the gate of the other of the MOS transistors constituting said second current mirror circuit and whose conduction state is controlled by the control signal.

* * * * *